United States Patent [19]

Gay et al.

[11] Patent Number: 4,581,625
[45] Date of Patent: Apr. 8, 1986

[54] VERTICALLY INTEGRATED SOLID STATE COLOR IMAGER

[75] Inventors: Charles F. Gay, Los Angeles; Robert D. Wieting, Simi Valley, both of Calif.

[73] Assignee: Atlantic Richfield Company, Los Angeles, Calif.

[21] Appl. No.: 562,952

[22] Filed: Dec. 19, 1983

[51] Int. Cl.$^4$ ...................... H01L 29/12; H01L 27/14
[52] U.S. Cl. ......................................... 357/30; 357/2; 357/45; 357/58
[58] Field of Search .................. 357/2, 30, 15, 31, 45, 357/58; 358/44

[56] References Cited

U.S. PATENT DOCUMENTS

| | | | |
|---|---|---|---|
| 4,149,907 | 4/1979 | Wronski et al. | 357/31 |
| 4,246,590 | 1/1981 | Thomas et al. | 357/30 |
| 4,271,328 | 6/1981 | Hamakawa et al. | 136/249 |
| 4,292,092 | 9/1981 | Hanak | 148/1.5 |
| 4,387,265 | 6/1983 | Dalal | 357/30 |
| 4,388,482 | 6/1983 | Hamakawa et al. | 136/258 |
| 4,412,236 | 10/1983 | Sasano et al. | 357/30 |

OTHER PUBLICATIONS

Ishioka, Sachio et al., *Single-Tube Color Imager Using Hydrogenated Amorphous Silicon*, Proceedings of the 14th Conference on Solid State Devices, Japanese Journal of Applied Physics, vol. 22 (1983) Supp. 22-1, pp. 461-464.

von Roeden, B., et al., *Optical Absorption, Photoconductivity, and Photoluminescence of Glow-Discharge Amorphous $Si_{1-x}Ge_x$ Alloys*, Physics Review B, vol. 25, No. 12 (Jun. 1982) pp. 7678-7687.

*Primary Examiner*—James W. Davie
*Assistant Examiner*—Vangelis Economou
*Attorney, Agent, or Firm*—Albert C. Metrailer

[57] ABSTRACT

A solid state color imaging device comprising a two dimensional array of stacked thin film photovoltaic devices with devices in each stack responsive to selected color bands. Color discrimination may be enhanced by design of intermediate transparent conductive layers to act as optical filters.

3 Claims, 4 Drawing Figures

4,581,625

VERTICALLY INTEGRATED SOLID STATE COLOR IMAGER

BACKGROUND OF THE INVENTION

The present invention relates to color imaging devices and more particularly to such a device fabricated from a two dimensional horizontal array of vertically stacked photovoltaic devices.

Considerably progress has been made in development of practical thin film photovoltaic devices. U.S. Pat. No. 4,388,482 issued to Hamakawa et al on June 14, 1983 teaches the construction of a p-i-n amorphous silicon photovoltaic cell and is hereby incorporated by reference for such teachings. While that patent is primarily involved with providing a solar cell with improved efficiency, that is greater power output, it also teaches that electrical bandgap, and therefore color band absorption and electrical response, of the resulting cell can be adjusted by appropriate selection of materials.

U.S. Pat. No. 4,292,092 issued to Hanak on Sept. 29, 1981 provides several additional teachings relating to assembly of photovoltaic cells into practical modules. The primary teaching involves the use of laser processing to scribe various conductor layers so that a monolithically fabricated panel may be cut into a number of series connected individual cells which improves efficiency by reducing resistive losses. In addition Hanak teaches the use of tandem, or stacked, series connected solar cells in such a module arrangement. The Hanak patent is also incorporated by reference.

Amorphous silicon structures have been used as active devices in an otherwise conventional vidicon type image pickup tube. See for example the publication, "Single-Tube Color Imager Using Hydrogenated Amorphous Silicon", by Sachio Ishioka, et al, Proceedings of the 14th Conference (1982 International) on Solid State Devices, Tokyo, 1982; Japanese Journal of Applied Physics, Volume 22 (1983) Supplement 22-1, pp. 461–464. Color separation is obtained by use of striped shaped organic filters so that color signals from each picture element are obtained from slightly different parts of the actual image.

SUMMARY OF THE INVENTION

The present invention is a solid stage color imager comprising a two dimensional array of tandem, or stacked, photovoltaic devices wherein each stack includes at least two separate devices and each device in each stack is adapted for response to a distinct color band. In a preferred form, each device also acts as a color filter for those devices positioned behind it in the stack. Orthogonal arrays of conductors, transparent where appropriate, provide random access to each individual device within each stack of devices which each define a picture element. In an alternative embodiment an intermediate transparent conductor layer is also designed as an optical filter to enhance color discrimination.

BRIEF DESCRIPTION OF THE DRAWINGS

The present invention may be better understood by reading the following detailed description of the preferred embodiments with reference to the accompanying drawings wherein.

DESCRIPTION OF THE PREFERRED EMBODIMENTS

Figure 1:
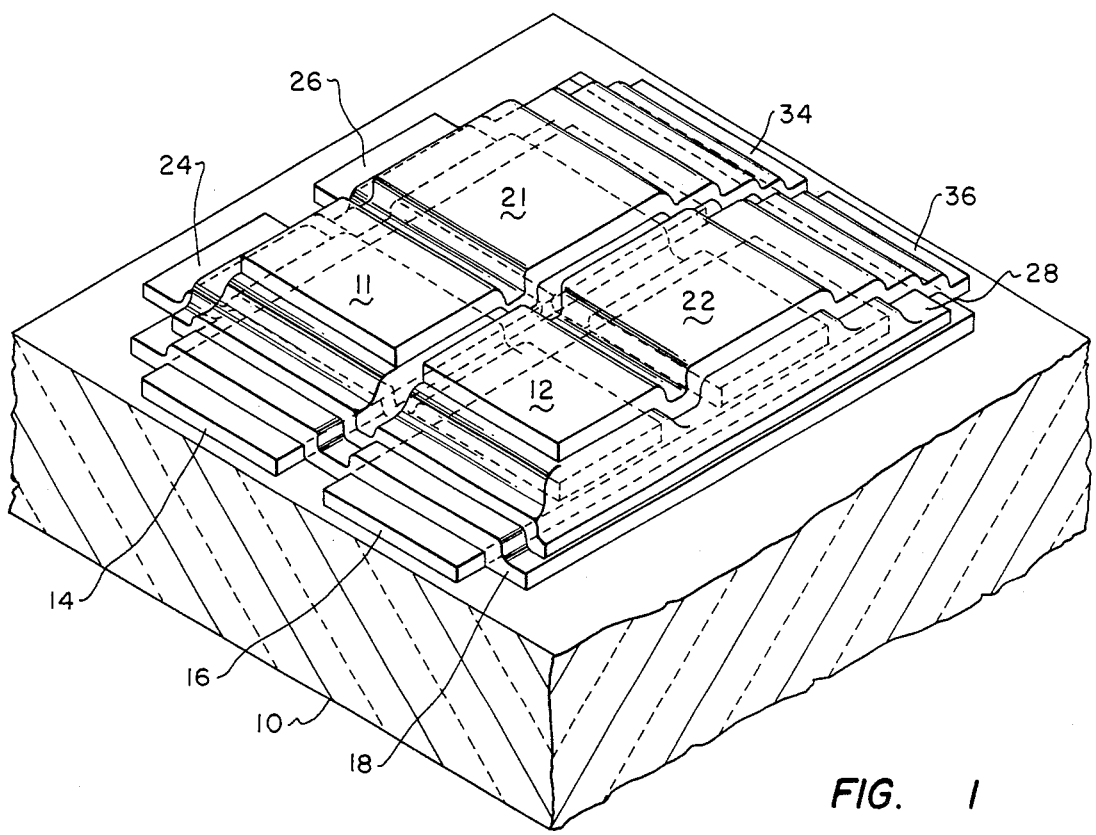
FIG. 1 is an isometric view of a color imaging device having four picture elements fabricated according to the present invention.

With reference now to FIG. 1 there is illustrated, in isometric view, a very simple color imaging device according to the present invention having only four picture elements (pixels). Practical color imaging devices such as would be useful in video cameras and the like would of course have a much larger two dimensional array of pixels. The device is fabricated on a glass substrate 10 although other transparent substrates including various plastic materials could also be used. An opaque insulating substrate may also be used if the devices are modified to receive light from the back side instead of through the substrate 10, as provided in the preferred embodiment. A first pair of transparent conductors 14 and 16 are deposited directly on substrate 10. These conductors may initially be deposited as a continuous layer of, for example, tin oxide which is then patterned into a plurality of linear strip conductors as illustrated. Laser processing as taught by the above referenced Hanak patent or other scribing or photolithographic processes may be used to pattern the transparent oxide to form the conductive strips 14 and 16. The spacing between conductors 14 and 16, and the other conductors in FIG. 1, is exaggerated for purposes of illustration and will be as small as practical in an actual device. At least one end of each strip 14 and 16 extends to an edge of substrate 10 to allow for electrical connection to external circuitry.

A first active photovoltaic layer 18 is deposited over the transparent conductors 14 and 16. This layer 18 is deposited continuously over the entire substrate 10 and is patterned only as necessary to allow contact to conductors 14 and 16, etc. In the preferred embodiment, layer 18 is a p-i-n structure fabricated from amorphous silicon in a manner such as that taught by the above referenced Hamakawa, et al patent. Layer 18 (and the layer 28 described below) is preferably selected to have relatively low sheet conductivity. This allows layer 18 to act as an insulator in the horizontal direction, that is, no significant currents flow between conductors 14 and 16. However such low conductivity does not interfere with the vertical photoconductive function. As will be discussed in more detail below, layer 18 is modified slightly, or other means are provided, to make layer 18 respond primarily to a desired color band.

A second pair of transparent conductors 24 and 26 are fabricated on top of the active layer 18. These strip conductors are preferably fabricated in essentially the same manner as used to fabricate conductors 14 and 16. As illustrated, conductors 24 and 26 lie perpendicular to conductors 14 and 16 and have at least one end extending to an edge of the substrate 10 where electrical contact to external circuitry may be made.

A second photovoltaic layer 28 is deposited over conductors 24 and 26 and first layer 18 where it has been exposed by patterning of the conductors 24 and 26. Layer 28 is generally coextensive with layer 18 being patterned only as necessary to allow electrical connections to be made to conductors 14, 16, 24 and 26. As will be explained in more detail below, in this embodiment layer 28 differs from layer 18 primarily in thickness to provide additional response to a second color band.

The final and top layer of the structure of FIG. 1 is another pair of conductors 34 and 36. In this embodiment, conductors 34 and 36 are fabricated from metal which has been evaporated or sputtered over the active layer 28. The metallic layer is then patterned again by laser scribing, photo lithographic techniques, or by deposition through a metal mask into the form of parallel linear strip conductors as illustrated in the figure. Conductors 34 and 36 are parallel to and lie essentially directly above first layer conductors 14 and 16. One end of each conductor 34 and 36 extends to an edge of substrate 10 for making electrical contact to external circuitry. Since conductors 34 and 36 form the top layer of the structure, electrical contact may be made at any point on the device but, for various practical reasons such as avoiding damage to the active structures, it is preferable to extend the conductors as illustrated.

The structure of FIG. 1 which has thus far been described forms a two by two array of photoresponsive elements labeled 11, 12, 21 and 22. Each of these elements includes a vertically integrated stack of two photoresponsive devices which are adapted to respond to a distinct color band of light, with the front device in each stack also acting as a color filter. The electrode structure allows random access to either or both color elements of any desired panel. In this preferred embodiment the upper, or back, layer 28 is adapted to respond to the red portion of the visible spectrum and the front layer 18 is designed to respond to the blue portion of the visible spectrum, and to filter out received blue light before it reaches layer 28. Thus, if it is desired to measure red intensity at pixel 11, a current (or voltage) reading is taken between conductors 24 and 34. Blue intensity of pixel 11 is measured by reading current (or voltage) between conductors 14 and 24. By various well known electronic engineering techniques, such as use of differential amplifiers for measuring voltage or the grounding of electrode 24, both red and blue intensities can be measured at pixel 11 simultaneously. It can be seen that by sequentially scanning voltages at appropriate pairs of electrodes all pixel outputs can be sensed. Sequential scanning of a full scale device will provide outputs directly adaptable to normal color video or still photography applications. The imager of the present invention differs from previous scanned imagers in that the different color outputs from each pixel are actually taken at the same physical spot in the image instead of at closely spaced slots having different color filters.

Figure 2:
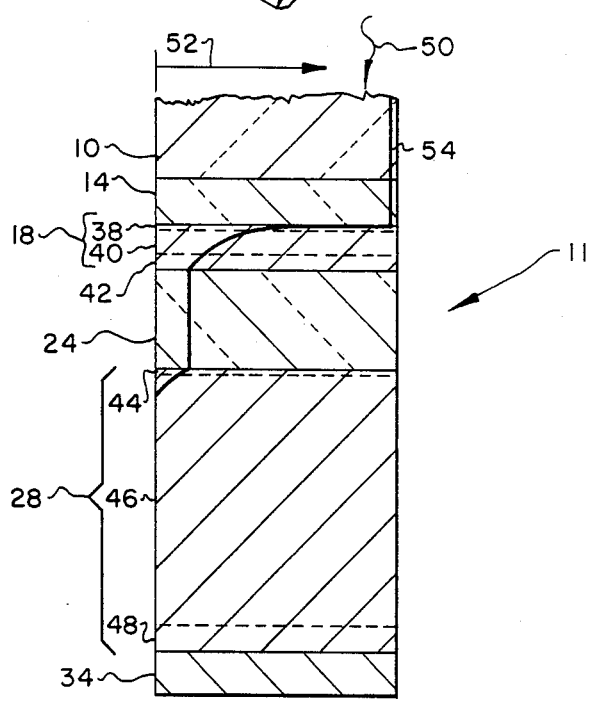
FIG. 2 is a cross-sectional illustration of one picture element of the device of FIG. 1 illustrating the filtering of and response to blue light.

With reference now to FIG. 2 there is illustrated more detail of the structure of a stacked color imaging element according to the present invention in the form of a cross-sectional illustration of pixel 11. The layers appearing in FIG. 1 carry corresponding reference numbers in FIG. 2. The FIG. 2 illustration has been turned over relative to FIG. 1 illustrating the light being received from the upper surface of FIG. 2. Only a portion of glass substrate 10 is illustrated since its actual thickness is orders of magnitude greater than the remaining device layers. Glass layer 10 may be typically up to 2 millimeters thick. In contrast, transparent conductor layers 14 and 24 are typically 2,000 to 3,000 angstroms thick. The third conductor 34 is about 1,000 angstroms thick.

The first photovoltaic layer 18, as indicated above, is preferably a p-i-n type amorphous silicon layer having a total thickness of about 1,000 angstroms. Layer 18 comprises a p layer 38, about 100 angstroms thick, an i layer 40, about 500 angstroms thick, and an n layer 42, about 400 angstroms thick. The second photovoltaic layer 28 has an overall thickness of about 5500 angstroms. It includes a p layer 44, about 100 angstroms thick, an i layer 46 about 5,000 angstroms thick, and an n layer 48 about 400 angstroms thick. Thus it is seen that the primary difference between layers 18 and 28 is the thickness of the i layers. This thickness difference provides color selectivity in this preferred embodiment where the same materials are used in layers 18 and 28 so that the specific sensitivity (per unit thickness) is the same in both layers with blue more strongly absorbed than red. Color selectivity can also be achieved by use of different materials having different bandgaps and resulting specific sensitivities, see for example the publication "Optical absorption, photoconductivity and photoluminescence of glow-discharge amorphous $Si_{1-x}Ge_x$ alloys", B. von Roedern, et al, American Physical Society, Physical Review B, Volume 25, Number 12, June 15, 1982.

In FIG. 2 incident blue light is indicated by the arrow 50 and relative intensity is indicated by the intensity scale 52 with intensity increasing to the right in the figure. A curve 54 indicating intensity versus depth of penetration into the structure of FIG. 2 is superimposed upon the cross-sectional illustration of light sensing element 11. Incident blue light suffers no appreciable losses as it passes through the glass substrate 10 and first transparent conductor layer 14. The first active layer 18 is highly absorbtive and responsive to blue light and rapidly filters such light reducing its intensity as it penetrates structure 18. Thus only a small percentage of the incident blue light reaches the intermediate transparent conductor 24 through which this small portion passes basically unattenuated. The small remaining portion of blue light which reaches the second active photovoltaic layer 28 is rapidly absorbed therein since layer 28 is also responsive to blue light. However since layer 18 has filtered substantially all of the incident blue light the electrical output measured across conductors 24 and 34 will be insignificant with that measured across conductors 14 and 24 in response to the blue light. Thus the stacked structure selectively indicates the presence of blue light by the output from the first layer 18.

Figure 3:
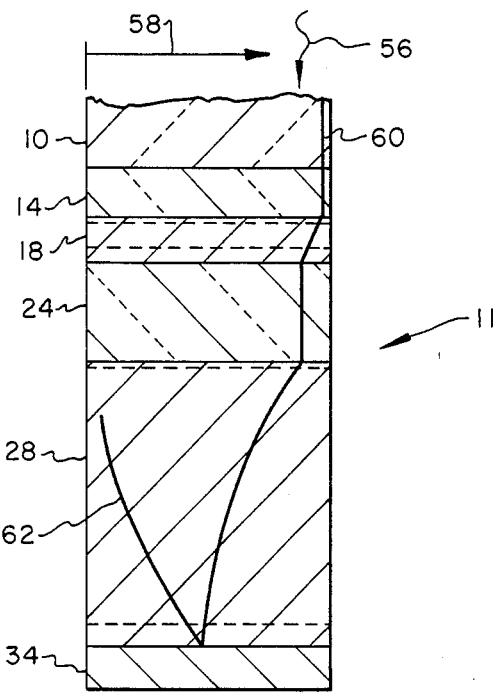
FIG. 3 is a cross-sectional view of one picture element of the device of FIG. 1 illustrating the transmission of and response to red light; and, FIG. 4 is a cross-sectional view of another embodiment having three light sensing cells per stack or picture element.

FIG. 3 is another illustration of the pixel 11 used to illustrate differential response to red light. In particular, incident red light is indicated by the arrow 56. Intensity is again indicated by the scale 58 increasing to the right. A curve 60 indicating intensity versus depth of penetration into the structure of FIG. 3 is again superimposed upon the illustration of light sensing element 11. As with the blue light the incident red light passes through the glass substrate 10 and first transparent conductor 14 with no noticeable attenuation. The photovoltaic structures 18 and 28 of the preferred embodiment are relatively inefficient absorbers of red light. To achieve good total absorption and response to red light the structures must be relatively thick. Therefore it is seen that the relatively thin photovoltaic structure 18 absorbs very little of, and therefore provides very little response to, incident red light 56. The intensity of red light reaching transparent conductor layer 24 is therefore very close to the original incident intensity and passes through with little attenuation. As a result most of the incoming red light reaches the upper surface of the second active region 28. By providing the increased thickness in layer 28, a large proportion of the red light is absorbed as it passes through layer 28 to the back surface at conductor 34. Metallic conductor 34 is basically reflective to red light and therefore greatly improves the efficiency of red light absorption within layer 28. As indicated by the portion 62 of curve 60, reflection of red light at layer 34 allows additional absorption and therefore additional response to red light as it passes back through layer 28 a second time. While layer 18 provides some response to red light, it is seen that most incident red light is transmitted by layer 18 and absorbed by layer 28 which therefore provides the primary response to red light. Layer 18 therefore acts as both a color filter, passing red light, and a detector of blue light.

Selectivity of the color discriminating elements of the present invention can also be improved by appropriate design of the intermediate transparent conductive layer 24. It is well known that by proper selection of thickness and index of refraction of such transparent layers optical filtering can be achieved. Depending upon desired filtering accuracy and band width, multiple layers of different indices of refraction may be required. In the preferred embodiment such a layer would be designed to reflect the blue band and would improve selectivity in two ways. It would reduce the blue light reaching the red responsive layer 28 and simultaneously would reflect the blue light back into the blue layer 18 increasing its response to blue light.

Figure 4:
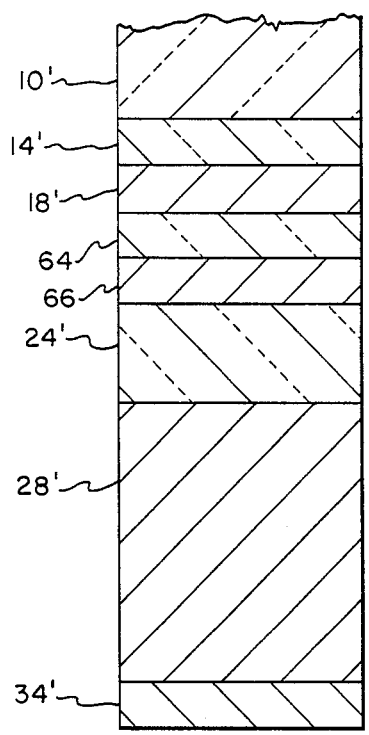

The preferred embodiment has been illustrated in terms of a stacked structure responsive to two bands of visible light. In many applications, this two color output is quite sufficient since, if it is desired, a third color band, for example green, can be synthetically generated by appropriate combination of the red and blue signals. However the present invention is not limited to a structure having only two light responsive layers. For example FIG. 4 illustrates a three color sensing element. In this structure layers 10', 14', 18', 24', 28', and 34', correspond to the layers of FIGS. 1 through 3 designated by the same unprimed reference numbers. An additional transparent conductor layer 64 and light responsive photovoltaic layer 66 have been added to the structure, positioned between layers 18' and layers 24'. Layer 64 would be a transparent conductive layer formed into linear strip conductors lying over and parallel to strip conductors 24 and 26 of FIG. 1. The conductors of layer 64 would extend to the fourth edge of substrate 10 of FIG. 1 for connection to external circuitry. A light responsive layer 66 may be essentially identical to layer 18 previously described. In this structure of FIG. 4 where layers 18' and 66 have the same thickness it is necessary to provide an additional means of discrimination between blue and green response. For example, as described above, transparent conductive layer 64 can be fabricated as an optical filter which reflects blue light, but passes green and red. In addition, by adjustment of bandgap, green response of layer 18' can be reduced and green response layer 66 can be enhanced. As described above with reference to FIGS. 2 and 3 control of intrinsic layer thickness can be used to establish layer 28' as the primary red receiving structure.

While the present invention has been illustrated and described with reference to particular structures and methods of fabrication it is apparent that various other changes and modifications can be made within the scope of the present invention as defined by the appended claims.

What is claimed is:

1. A solid state color imaging device comprising:
   a first plurality of spaced apart linear conductors supported on an insulating substrate,
   a first photovoltaic semiconductor layer deposited on said substrate and first conductors, said first semiconductor layer comprising a p-i-n amorphous silicon structure having i-layer thickness and/or bandgap selected to cause said layer to primarily absorb and provide electrical response to a first color band,
   a second plurality of spaced apart conductors deposited on said first semiconductor layer, said second conductors being transparent and aligned orthogonal to said first conductors,
   a second photovoltaic semiconductor layer deposited on said first layer and said second conductors, said second semiconductor layer comprising a p-i-n amorphous silicon structure having i-layer thickness and/or bandgap selected to cause said layer to primarily provide electrical response to a second color band, and
   a third plurality of spaced apart linear conductors deposited on said second semiconductor layer, said third conductors positioned above and in alignment with said first conductors.

2. A color imaging device according to claim 1 wherein said substrate and said first conductors are transparent and said third conductors are reflective of light in at least said second color band.

3. A color imaging device according to claim 1 wherein said substrate and said first conductors are transparent and said second conductors have a thickness and index of refraction selected to reflect said first color band and pass said second color band.

* * * * *